United States Patent [19]

Ahmed

[11] 4,166,964
[45] Sep. 4, 1979

[54] INVERTING BUFFER CIRCUIT

[75] Inventor: Adel A. A. Ahmed, Annandale, N.J.

[73] Assignee: RCA Corporation, New York, N.Y.

[21] Appl. No.: 858,784

[22] Filed: Dec. 8, 1977

[51] Int. Cl.² .................. H03K 17/00; H03K 1/00
[52] U.S. Cl. .................. 307/296 R; 307/264; 307/270; 330/257
[58] Field of Search ......... 307/296, 297, 270, DIG. 1, 307/264; 330/257, 288

[56] References Cited

U.S. PATENT DOCUMENTS

| 3,815,037 | 6/1974 | Wheatly, Jr. | 330/257 |
| 3,872,323 | 3/1975 | Frederiksen et al. | 330/257 |

OTHER PUBLICATIONS

IBM Tech. Disclosure Bulletin, Translating Output Driver, vol. 18, No. 11, 4/76, p. 3589.

Primary Examiner—Stanley D. Miller, Jr.
Assistant Examiner—B. P. Davis
Attorney, Agent, or Firm—H. Christoffersen; Samuel Cohen; Allen LeRoy Limberg

[57] ABSTRACT

A current source supplies a constant current to a node leading to two parallel branch circuits. The first, comprising a plurality of series connected semiconductor junctions, connects to the input terminal of a current mirror amplifier (CMA) and the second branch circuit comprising the emitter-to-collector path of a transistor, connects to the output terminal of the CMA. An input signal applied to the base of the transistor causes the constant current to steer mainly into the first branch circuit when the signal exceeds a threshold level and mainly into the second branch circuit when the signal is lower than this threshold level. The output signal, which is available at the output terminal of the CMA, comprises a current at a relatively low voltage level which, in one case, is supplied to, and in the other is withdrawn from, the load circuit connected to this terminal.

7 Claims, 1 Drawing Figure

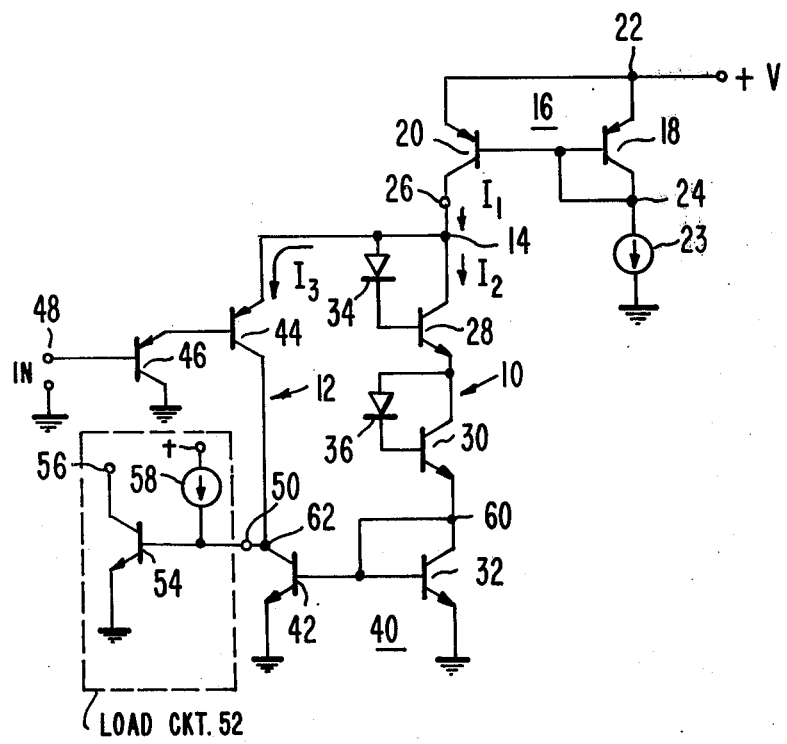

INVERTING BUFFER CIRCUIT

The present invention relates to a buffer circuit.

There are many applications in which it is desired to receive a voltage at one level and to produce in response thereto, an output at a second voltage level. In one particular application of present interest, the input signal represents a binary digit and the buffer is required to translate the signal voltage to a current at a low voltage level. The buffer is also required to have a high input impedance, to have a sharp threshold at a level to distinguish a 1 from a 0 level and sufficiently high to provide good noise immunity, and it is also required to tolerate, without damage, relatively large voltage excursions at the input terminal to the buffer.

In the drawing:

The single FIGURE is a circuit diagram of an inverting buffer circuit which meets the needs discussed above.

Referring to the drawing, the circuit shown includes first and second parallel branches 10 and 12 connected between common terminal 14 and a point of reference potential, shown as ground. A constant current $I_1$ is supplied to terminal 14 by a current source shown as a current mirror amplifier (CMA) 16, but which may be some other form of constant current source.

The current mirror amplifier includes two PNP transistors 18 and 20. The input transistor 18 is connected to operate as a diode, that is, its base electrode is connected to its collector electrode and the output transistor 20 is connected base-to-base with the input transistor. The emitter electrodes of transistors 18 and 20 connect to the common terminal 22 of the CMA which, in turn, connects to an operating voltage source +V. A current source 23, which may be a resistor or another CMA, as examples, connects to the input terminal 24 of the current mirror amplifier 16. The output terminal 26 of the current mirror amplifier connects to the common input terminal 14 of the parallel branch circuits.

The first branch circuit 10 includes three NPN transistors 28, 30 and 32. The emitter of transistor 28 is connected to the collector of transistor 30; the emitter of transistor 30 is connected to the collector 32; and the emitter of transistor 32 is connected to ground. A diode 34, which may be a semiconductor junction or a diode-connected transistor, is connected at its anode to the collector of transistor 28 and at its cathode to the base of transistor 28. A second diode 36 is similarly connected between the collector and base of transistor 30. Transistor 32 comprises the input transistor of a second current mirror amplifier 40. Transistor 32 is diode connected, that is, its collector is connected to its base and the transistor 32 is also connected at its base to the base of output NPN transistor 42.

The second branch circuit comprises the emitter-to-collector path of PNP transistor 44 and the collector-to-emitter path of the output transistor 42 of CMA 40. This transistor 42 is connected at its emitter to ground and at its collector to the collector of PNP transistor 44.

The input transistor to the circuit comprises PNP transistor 46 which is connected at its emitter to the base of transistor 44, at its collector to ground, and at its base to input terminal 48.

The circuit output terminal is at 50 and the current available there drives a load circuit 52. For purpose of illustration, the load circuit is shown as a portion of a current mode logic state which is known colloquially as "I²L." This state includes an input NPN transistor 54 which is connected at its base to output terminal 50 and at its emitter to ground. Other circuit elements, not shown, make available to the collector of transistor 54 a supply current which is available at terminal 56. A current source 58 supplies current to the base of transistor 54. When this current passes through the base-emitter junction of transistor 54, transistor 54 draws collector current and in this condition, the binary digit it represents is a 1. When the voltage conditions are such that current from source 58 does not pass through the base-emitter junction of transistor 54, this transistor is cut off and does not draw collector current. This condition represents a binary 0.

In the operation of the circuit, the constant current source comprising CMA 16 supplies a constant current $I_1$ to the common terminal 14. The first branch circuit 10, when it is carrying current, establishes a voltage between point 14 and ground equal to $5V_{BE}$, where $V_{BE}$ is the threshold voltage which appears across a semiconductor junction such as a base-emitter junction, when current flows through that junction in a direction as to forward bias it. Note that there are five essentially series connected semiconductor junctions in the path 10. The first such junction is that across diode 34, the second is the base-emitter junction of transistor 28, the third is that across diode 36, the fourth is the base-emitter junction of transistor 30 and the fifth is the base-emitter junction of transistor 32. It is assumed here that all of these elements and indeed of the remaining elements illustrated are integrated on a common substrate and that the various $V_{BE}$'s are of equal value when referred to the same junction current density. In practice, $1V_{BE}$ may be of the order of 0.65 volts or so.

There are two base-emitter junctions between input terminal 48 and common terminal 14, namely the base-emitter junctions of transistors 46 and 44. For purpose of the present explanation, assume that the input circuit (not shown) connected to input terminal 48 is designed to produce a voltage which ideally is at a level of five volts when that voltage is intended to represent a 1 and at a level of zero volts when it is intended to represent a 0. The present circuit establishes a threshold of $+3V_{BE}$ ($5V_{BE}$ of branch 10, minus $V_{BE44}$, minus $V_{BE46}$, where $V_{BE44}$ and $V_{BE46}$ are the base-emitter threshold voltages of transistors 44 and 46, respectively) and for purposes of the present explanation, it will be assumed that this is about +2 volts. In other words, if the input voltage is equal to or lower (i.e. less positive) in value than about two volts, it will be assumed to represent a 0 and if it is higher than about two volts, it will be assumed to represent a 1.

Assume now that the input voltage applied to terminal 48 is at precisely the threshold value of $3V_{BE}$. In this case because the circuit branch 10 will have exactly the same voltage across it as the circuit from point 14 through the base-emitter junctions of transistor 44 and 46, to terminal 48 to ground, the current $I_1$ will divide into two parts $I_2$ and $I_3$ which are substantially equal. The current $I_2$ flows into the input terminal 60 of the current mirror amplifier 40. The transistors 32 and 42 of the current mirror amplifier are designed to have equal base-emitter junction areas so that to a first approximation, the output transistor 42 of the current mirror amplifier demands the same current from the collector of transistor 44 as flows into the input terminal 60 of the mirror. This transistor 44 has just this amount of current available so that all of the collector current supplied by transistor 44 flows into the output terminal 62 of current mirror amplifier 40. In the present circuit as the collector of transistor 44 is supplying the entire output current demand of current mirror amplifier 40, none of the current from current source 58 flows into the output terminal 50 of the circuit. Instead all of this current flows into the base of transistor 54 so that transistor 54 continues to remain on and the output of the circuit represents a 1.

Assume now that the input voltage applied to terminal 48 represents a 1, that is, it is greater than two volts and ideally is five volts. In this case, the voltage from ground through the base-emitter junctions of transistor 46 and 44 to common terminal 14 would, if current flowed through this path, be substantially greater than the voltage from terminal 14 to ground across the first branch 10. Put another way, the current $I_1$ sees a relatively high impedance looking into the emitter of terminal 44 and a relatively low impedance looking into the first branch circuit 10. The current $I_1$, therefore, steers mainly (actually, substantially entirely) into the first branch circuit 10 and into the input terminal 60 of the CMA 40. The output terminal 62 of the CMA 40 now demands a similar amount of current from the collector of transistor 44; however, the collector of transistor 44 supplies little or no current and therefore cannot meet this demand. The demand rather is met in part by the current source 58 which supplies substantially the entire current it has available to the collector of transistor 42, diverting this current away from the base of transistor 54. As no, or substantially no, base current is available for transistor 54, this transistor cuts off and can receive no current at its collector electrode from terminal 56. Thus, the condition of the output circuit 52 represents a 0 in response to an input voltage at terminal 48 which represents a 1. Accordingly, the circuit has produced an output which is the complement of the input signal; the circuit has operated as an inverting buffer.

Assume now that the input voltage represents a 0, that is, it is a value less than the threshold level of two volts and ideally is zero. In this case, the voltage drop from ground through terminal 48 and through the base-emitter junctions of transistors 46 and 44 is much lower than what the voltage drop across the first branch 10 of the circuit would be if it conducted current. Under these circumstances, the input current $I_1$ steers mainly (actually substantially entirely) into the emitter of transistor 44 with very little current $I_2$ flowing into the first branch 10 of the circuit. Now the input terminal 60 of the CMA 40 receives little or no current so that the output terminal 62 at the collector of transistor 42 demands little or no current from the collector of transistor 44. However, transistor 44 is conducting heavily. Aside from the small amount of base current flowing through the base-emitter junction of transistor 46, almost the entire current $I_3$ (which is substantially equal to the current $I_1$) flows in the emitter-to-collector path of transistor 44. This collector current now passes into the base of output transistor 54 and, assuming transistor 54 has been off previously, it and the current available from source 58 rapidly switch transistor 54 to a highly conducting condition. This transistor 54 now draws collector current from terminal 56 and in this condition of the circuit, it represents a 1. Again, an inverting function has been performed. Note also that the output signal, when it represents a 1, is a current at a voltage level equal to $1V_{BE}$ (the drop across the base-emitter junction of 54) which may be of the order of 0.65 volts or so (whereas the input signal, when it represents a 1, is ideally +5 volts in this example).

The present circuit has a number of important operating features. For example, its input impedance is high due to the high $\beta$ (current gain) of the vertical geometry PNP transistor 46. The 1-to-0 and 0-to-1 transitions are very sharp both because there is a very precise threshold level and because of the current differential technique employed. The circuit is very tolerant of high input voltages since the input transistor 46 is a PNP transistor and the base-to-collector reverse breakdown voltage is very high—of the order of sixty volts in one particular design. Further, should the input signal level reverse and become more negative than ground, there is no harm done to the circuit as the collector is clamped to ground.

The complete circuit shown may be integrated onto a small substrate area. Only "two" of the transistors are lateral geometry PNP transistors—namely, 44 and the transistors of mirror 16. While the latter appear in the circuit diagram to be two transistors, in practice they can be made by employing an N layer as the base, a single P region in the N layer serving as both the emitter electrodes and two laterally spaced P regions serving as the two collectors. The transistor diode pairs such as 34, 28 may each be fabricated in one N boat and thus each occupies only a small area. Transistor 46 is a PNP transistor but it may be made in vertical geometry.

While for purpose of illustration, the present circuit has been shown to have a threshold equal to $3V_{BE}$, it is to be understood that this is intended as an example only. The threshold readily can be increased, for example, by placing additional semiconductor junctions in series with those illustrated in path 10. These junctions, of course, should be poled in the same direction as the remaining junctions in this path. The threshold voltage can be decreased by removing one or more of the essentially series-connected junctions from the path 10. As an alternative, the path 10 structure can remain unchanged and the threshold voltage decreased by, for example, adding one or more base-emitter junctions in series with the path between terminal 48 and terminal 40. These too should be poled in the same direction as the ones illustrated. Further, while in the present circuit, the threshold voltage is established by base-emitter or other semiconductor junction voltage drops, there are other possibilities. As one example, one could employ the breakdown voltage of one or more zener diodes in paths 10 or in the path between terminal 14 and input terminal 48.

What is claimed is:

1. A buffer circuit comprising, in combination:
   a current mirror amplifier having a common terminal connected to a point of reference potential and input and output terminals;
   a circuit node;
   a first branch circuit connected between said node and the input terminal of said current mirror amplifier, said first branch circuit including means responsive to current flow therethrough for developing across said branch circuit a voltage at a given level;
   a second branch circuit connected between said circuit node and said output terminal of said current mirror amplifier, said second branch circuit including the emitter-to-collector path of a transistor, said transistor being connected at its emitter electrode to said node and said transistor having also a base electrode and a base-emitter junction;

a buffer circuit input terminal to which an input signal may be applied coupled to said base electrode;

a buffer circuit output terminal, at which the buffer circuit output signal is available, at the output terminal of said current mirror amplifier; and a constant current source supplying a constant current to said node, whereby when said input signal is greater than a given threshold level, said constant current steers mainly into said first branch circuit, and when said input signal is lower than a given level, said constant current steers mainly into said second branch circuit.

2. A buffer circuit as set forth in claim 1, wherein said first branch circuit comprises a plurality of semiconductor junctions poled in the same direction connected essentially in series.

3. A buffer circuit as set forth in claim 2, further including at least one semiconductor junction connected between said input terminal and said base electrode poled in the same direction as said base-emitter junction.

4. A buffer circuit as set forth in claim 3, wherein said one semiconductor junction comprises the base-emitter junction of a transistor, said transistor having a collector electrode connected to said point of reference potential.

5. A buffer circuit as set forth in claim 1, further including a load circuit, said load circuit comprising a second current source connected to said output terminal, and a semiconductor junction connected between said second current source and said point of reference potential, said junction being poled in the forward direction relative to the current supplied thereto by said second current source.

6. A buffer circuit as set forth in claim 2, wherein said first branch circuit comprises a second transistor having base, emitter and collector electrodes and a base-emitter junction, connected at is collector electrode to said circuit node and coupled at its emitter electrode to said input terminal of said current mirror amplifier, and a semiconductor junction connected between said base and said collector electrodes, poled to conduct in the same direction as the base-emitter junction of said second transistor.

7. A buffer circuit as set forth in claim 1, wherein said first branch circuit comprises N semiconductor junctions connected essentially in series in the forward direction for current flow from said constant current source, and wherein the path between said circuit node and said input terminal includes M semiconductor junctions, including said base-emitter junction, said junctions in said path being connected essentially in series in the forward direction for current flow from said constant current source, where N and M are both integers, N being larger than M.

* * * * *